United States Patent
Malinge et al.

(10) Patent No.: US 7,428,175 B2
(45) Date of Patent: Sep. 23, 2008

(54) MEMORY WITH A MEMORY CELL COMPRISING A MOS TRANSISTOR WITH AN ISOLATED BODY AND METHOD OF ACCESSING

(75) Inventors: Pierre Malinge, La Tessoualle (FR); Rossella Ranica, Grenoble (FR)

(73) Assignee: STMicroelectronics, SA, Montrouge (FR)

( * ) Notice: Subject to any disclaimer, the term of this patent is extended or adjusted under 35 U.S.C. 154(b) by 146 days.

(21) Appl. No.: 11/636,315

(22) Filed: Dec. 8, 2006

(65) Prior Publication Data
US 2007/0133309 A1  Jun. 14, 2007

(30) Foreign Application Priority Data
Dec. 8, 2005  (FR) .................................. 05 53767

(51) Int. Cl.
*G11C 7/10* (2006.01)
(52) U.S. Cl. .......................... 365/189.011; 365/185.01; 365/185.09
(58) Field of Classification Search .......... 365/185.011, 365/185.01, 185.09
See application file for complete search history.

(56) References Cited

U.S. PATENT DOCUMENTS 7,212,434 B2 * 5/2007 Umezawa ............... 365/185.01
2004/0228168 A1  11/2004 Ferrant et al.

FOREIGN PATENT DOCUMENTS

DE  31 38950  9/1981

* cited by examiner

*Primary Examiner*—Anh Phung
*Assistant Examiner*—Nam Nguyen
(74) *Attorney, Agent, or Firm*—Noblitt & Gilmore, LLC

(57) ABSTRACT

A dynamic random access memory (DRAM) including memory cells distributed in rows and in columns, each memory cell comprising a MOS transistor with a floating body, the memory comprising circuitry for writing a datum into a determined (i.e. selected) memory cell belonging to a determined (i.e. selected) row and to a determined (i.e. selected) column, wherein the write circuitry comprises circuitry capable of bringing the drains of the memory cells of the determined column to a voltage $V_1$; circuitry capable of bringing the sources of the memory cells of the determined row to a voltage $V_2$; and circuitry capable of bringing the drains of the memory cells of the columns other than the determined column and the sources of the memory cells of the rows other than the determined row to a voltage $V_3$, voltages $V_1$, $V_2$, and $V_3$ being such that $|V_1-V_2|>|V_3-V_2|$ and $(V_1-V_2)\times(V_3-V_2)>0$.

9 Claims, 2 Drawing Sheets

MEMORY WITH A MEMORY CELL COMPRISING A MOS TRANSISTOR WITH AN ISOLATED BODY AND METHOD OF ACCESSING

BACKGROUND OF THE INVENTION

1. Field of the Invention

The present invention relates to a DRAM structure (Dynamic Random Access Memory) with a transistor formed in a floating body or well and a method of reading, writing and holding information in such a DRAM structure.

2. Discussion of the Related Art

FIG. 1 schematically shows a conventional example of a DRAM 5 comprising memory cells distributed in rows and in columns. Only four memory cells $T_{1,1}$, $T_{1,2}$, $T_{2,1}$, $T_{2,2}$ distributed in two rows and two columns are shown. Each memory cell corresponds to a MOS-type field effect transistor. The drains of the memory cells of a same column are connected to a drain line $DL_i$, i being equal to 1 or 2 in the present example, also called bit lines. The gates of memory cells of a same row are connected to a gate line $GL_i$, i being equal to 1 or 2 in the present example, also called a word line. The sources of the memory cells of a same row are connected to a source line $SL_i$, with i ranging between 1 and 2 in the present example.

FIG. 2 is a simplified cross-section view of an example of a memory cell of DRAM 5, for example, memory cell $T_{1,1}$. Memory cell $T_{1,1}$ comprises an N-channel MOS transistor 10 formed in a floating body region 11 laterally delimited by an insulating ring 12 and, depthwise, by an N-type layer 13 formed in a P-type substrate 14. MOS transistor 10 comprises, on either side of gate region 16 surrounded with spacers 17 and resting on a gate insulator 18, N-type source and drain regions 19 and 20. Each of the source and drain regions comprises a deeper, more heavily doped region outside of the region defined by spacers 17 and a shallower, less heavily-doped region under the spacers. Drain line $DL_1$ is connected to drain region 20, source line $SL_1$ is connected to source region 19, and gate line $GL_1$ is connected to gate 16.

In the absence of a specific action on the memory cell, floating body 11 is at a given potential corresponding to the thermal balance. It has been shown that positive or negative charges could be injected into this body, setting the selected memory cell(s) to one or the other of two determined states which will be called 1 and 0. According to this substrate biasing, the threshold voltage of the transistor modifies and states 1 and 0 can thus be distinguished.

Further, FIG. 2 shows an N-type conductive well 21 connecting with buried layer 13 to enable biasing hereof. In FIG. 2, the biasing terminal is called NISO, and buried layer 13 can be called the insulation layer. Biasing terminal NISO is maintained at a constant value, preferably at a slightly positive value.

In the following description, the given example corresponds to a technology in which the minimum possible dimension of a pattern is on the order of 0.12 µm and in which a gate length on the order of 0.30 µm and a depth of insulating regions 12 on the order of 0.35 µm have been selected, as well as a gate oxide thickness on the order of 6 nm.

FIG. 3 shows the voltages to which the control lines of memory 5 of FIG. 1 are brought in the case of a hold operation, also called operation of retention of the data stored in the transistors. Such an operation is the operation by default of memory 5, that is, in the absence of a data read or write operation in the memory cells. Conventionally, all the control lines are set to the reference voltage of memory 5, generally ground potential, defined as equal to 0 V in the exemplary descriptions hereafter. Thereby, all transistors are blocked and the data stored in the transistors is not modified.

FIG. 4 shows the voltages to which the control lines of memory 5 of FIG. 1 are brought for an operation of writing a "1" into memory cell $T_{1,1}$. As compared with the hold operation, drain line $DL_1$ is set to a high voltage, for example, +2.5 V. It may be the voltage provided by the positive power supply source (Here please insert a reference numeral corresponding to a block representing a power supply source to be added to the drawing) of memory 5. Gate line $GL_1$ is set to a voltage intermediary between the reference voltage and the high voltage, in the present example, 1.2 V. Transistor $T_{1,1}$ is then on, the other memory transistors being off. The drain-source voltage of transistor $T_{1,1}$ being high, transistor $T_{1,1}$ is set to a relatively strong conduction state. At the end of this state, when all the voltages of the control lines are brought back to zero, positive charges (holes) have accumulated in the floating body. Once memory cell $T_{1,1}$ is at equilibrium, these charges tend to narrow the space charge areas at the level of the junctions delimiting body 11. Transistor $T_{1,1}$ then has a low threshold voltage, that is, in a read state in which the transistor is slightly biased to the on state, a first current will be observed for a given gate voltage.

FIG. 5 shows the voltages to which the control lines of memory 5 of FIG. 1 are brought in an operation of writing of a "0" into memory cells $T_{1,1}$ and $T_{1,2}$ of memory 5. Such an operation is also called an erasing operation. As compared with the hold operation, gate line $GL_1$ and source line $SL_1$ are set to a low voltage, for example, –1.2 V. Each of transistors $T_{1,1}$ and $T_{1,2}$ is off, its gate and its source being set to a negative voltage, whereby the positive voltages possibly present in body 11 are eliminated and negative charges are injected after the setting to the on state of the body-source diode. At the end of this state, the space charge areas of the junctions delimiting body 11 tend to widen and this results in an increase in the transistor threshold voltage. Transistors $T_{1,1}$ and $T_{1,2}$ then have a high threshold voltage.

FIG. 6 shows the voltages to which the control lines of memory 5 of FIG. 1 are brought in the case an operation of reading the data stored in memory cell $T_{1,1}$. As compared with the hold operation, drain line $DL_1$ and gate line $GL_1$ are set to 1.2 V. Transistor $T_{1,1}$ is thus slightly biased to the on state. The threshold voltage of transistor $T_{1,1}$ depends on the data memorized in transistor $T_{1,1}$. Thus, in read conditions in which the transistor is slightly biased to the on state, a lower current is obtained for a same 1.2-V gate voltage when datum "0" is stored in transistor $T_{1,1}$ and a higher current is obtained when datum "1" is stored in transistor $T_{1,1}$. By "datum" is meant information in the form of a binary data bit, e.g. bit "0" or bit "1". The current flowing through the MOS transistor is measured or, preferably, compared with a reference value ranging between the current values corresponding to states 1 and 0. Thus, the memory effect of a memory cell according to an embodiment of the present invention characterizes by a difference between a current at state 1 and a current at state 0 for a given drain-source biasing and for a given gate voltage.

A disadvantage of such a memory 5 is that an operation of writing of a datum "1" into a memory cell can modify the data stored in the memory cells of the same column. Indeed, as shown in FIG. 4, in an operation of writing into memory cell $T_{1,1}$, the drain and the source of memory cell $T_{2,1}$ are set to voltages, respectively of 2.5 V and 0 V.

In this case, the capacitive coupling exerted by the drain on body 11 of memory cell $T_{2,1}$ causes an increase in the voltage of body 11 of memory cell $T_{2,1}$. This voltage increase tends to forward bias the source junction of memory cell $T_{2,1}$. The positive charges possibly stored in body 11 can thus leak through the source junction, causing a decrease in the number of positive charges stored in body 11. It may then no longer be possible to detect that datum "1" is stored in such a memory cell.

SUMMARY OF THE INVENTION

The invention described herein is a dynamic random access memory (DRAM) formed of memory cells having a MOS transistor with an isolated body, distributed in rows and columns, and a method for controlling such a memory enabling avoiding an unwanted modification of data stored in memory cells adjacent to a memory cell at the level of which a write operation is performed.

For this purpose, the invention provides a DRAM comprising memory cells distributed in rows and in columns, each memory cell comprising a MOS transistor with a floating body, the memory comprising means for writing a datum (information in the form of data bits) into a determined (i.e. selected) memory cell belonging to a determined (i.e. selected) row and to a determined (i.e. selected) column. The write means comprise means capable of bringing the drains of the memory cells of the determined column to a voltage $V_1$; means capable of bringing the sources of the memory cells of the determined row to a voltage $V_2$; and means capable of bringing the drains of the memory cells of the columns other than the determined column and the sources of the memory cells of the rows other than the determined row to a voltage $V_3$, voltages $V_1$, $V_2$, and $V_3$ being such that $|V_1-V_2|>|V_3-V_2|$ and $(V_1-V_2)\times(V_3-V_2)>0$. Such means are typically power (voltage or current) sources, decoders and/or logic circuits for providing the desired voltages/currents, as well as read, write and hold voltage levels to the memory cells and are generically defined herein as circuitry. Those skilled in the art can readily find such circuitry for generating the specific voltage levels desired to be applied, once apprised of the voltage levels to be applied to the memory cells in accordance with the invention.

According to an embodiment of the present invention, the memory comprises means (i.e. circuitry) for holding the data stored in the memory cells of the memory, the hold means being capable of bringing the drains and the sources of all the memory cells in the memory to voltage $V_3$.

According to an embodiment of the present invention, the memory comprises means for reading the datum stored in the determined memory cell, the read means comprising means capable of bringing the sources of the memory cells of the determined row to voltage $V_2$; and means capable of bringing the drains of all the memory cells in the memory and the sources of the memory cells of the rows other than the determined row to voltage $V_3$.

According to an embodiment of the present invention, the memory comprises means for erasing the data stored in the memory cells of the determined row, the erasing means comprising means capable of bringing the sources and the gates of the memory cells of the determined row to a voltage $V_4$, voltage $V_4$ being such that $(V_1-V_2)\times(V_4-V_2)<0$; and means capable of bringing the drains of all the memory cells in the memory and the sources of the memory cells of the rows other than the determined row to voltage $V_3$.

According to an embodiment of the present invention, at least one means from among the group comprising the write means, the hold means, and the read means is capable of bringing the gates of all the memory cells in the memory to voltage $V_3$.

An embodiment of the present invention also provides a method for controlling a DRAM comprising memory cells distributed in rows and in columns, each memory cell comprising a MOS transistor with a floating body, in which an operation of writing of a datum into a determined memory cell belonging to a determined row and to a determined column comprises the steps of bringing the drains of the memory cells of the determined column to a voltage $V_1$; of bringing the sources of the memory cells of the determined row to a voltage $V_2$; and of bringing the drains of the memory cells of the columns other than the determined column and the sources of the memory cells of the rows other than the determined row to a voltage $V_3$, voltages $V_1$, $V_2$, and $V_3$ being such that $|V_1-V_2|>|V_3-V_2|$ and $(V_1-V_2)\times(V_3-V_2)>0$.

According to an embodiment of the present invention, voltage $V_2$ is the ground voltage of the memory.

According to an embodiment of the present invention, an operation of holding of the data stored in the memory cells in the memory comprises the step of bringing the drains and the sources of all the memory cells in the memory to voltage $V_3$.

According to an embodiment of the present invention, an operation of reading the datum stored in the determined memory cell comprises the steps of bringing the sources of the memory cells of the determined row to voltage $V_2$; and of bringing the drains of all the memory cells in the memory and the sources of the memory cells of the rows other than the determined row to voltage $V_3$.

According to an embodiment of the present invention, an operation of erasing the data stored in the memory cells of the determined row comprises the steps of bringing the sources and the gates of the memory cells of the determined row to a voltage $V_4$, voltage $V_4$ being such that $(V_1-V_2)\times(V_4-V_2)<0$; and bringing the drains of all the memory cells in the memory and the sources of the memory cells of the rows other than the determined row to voltage $V_3$.

According to an embodiment of the present invention, at least one of the operations from the group comprising the write operation, the hold operation, and the read operation comprises bringing the gates of all the memory cells in the memory to voltage $V_3$.

The foregoing object, features, and advantages, of the present invention, as well as others, will be discussed in detail in the following non-limiting description of specific embodiments in connection with the accompanying drawings.

DETAILED DESCRIPTION

Figure 1:
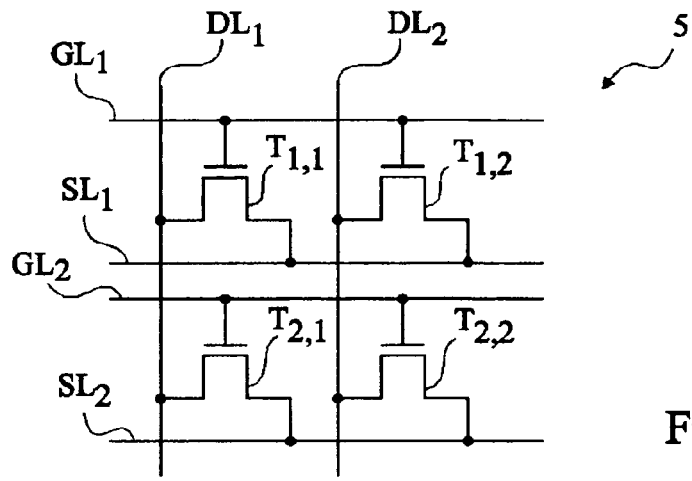
FIG. 1, previously described, schematically shows a DRAM with four memory cells.
Figure 3:
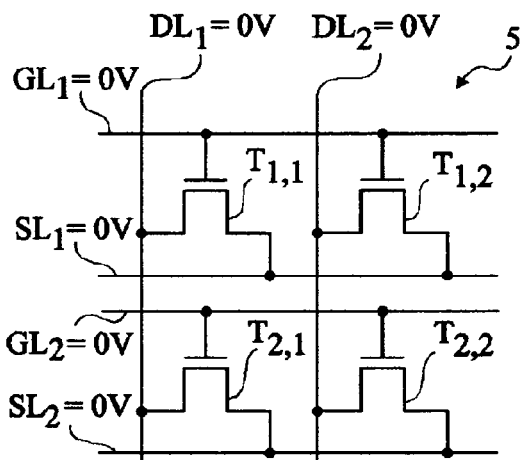
FIGS. 3 to 6, previously described, show the voltages to which are brought the control lines of the memory of FIG. 1, respectively for hold, write, erasing, and read operations.

For clarity, same elements have been designated with same reference numerals and, further, as usual in the representation of integrated circuits, the various drawings are not to scale.

Figure 2:
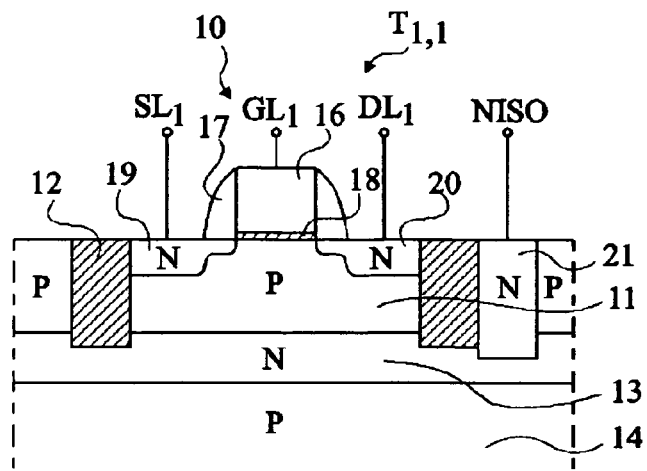
FIG. 2, previously described, schematically shows a memory cell having a transistor with a floating body.

In the following description, a DRAM 5 of matrix type will be considered, for which the memory cells have, as an example, the structure shown in FIG. 2. The voltage applied to terminal NISO remains substantially constant along the operation of memory 5 and is, for example, on the order of 1.2 V.

An embodiment of the present invention provides, in a write operation, decreasing the drain-source voltages of the memory cells adjacent to the addressed memory cell with respect to the drain-source voltage of the addressed memory cell, to limit risks of disturbance of the data stored in the memory cells adjacent to the addressed memory cell. This is obtained by bringing the source lines other than the source line associated with the memory cell to be addressed to an intermediate voltage greater than the reference voltage of the memory. To limit switching operations on the control lines, it is then provided, in a hold operation, to maintain the drain lines, the source lines, and the gate lines at such an intermediary voltage called the hold voltage.

Figure 7:
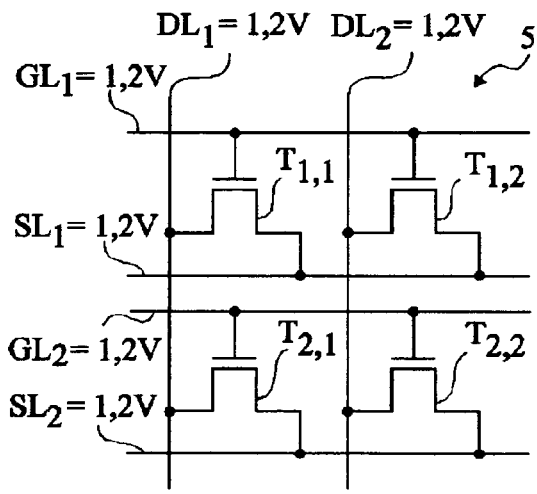
FIGS. 7 to 10 show an example of voltages to which are brought the control lines of a memory according to an embodiment of the present invention, respectively for hold, write, erasing, and read operations.

FIG. 7 shows an example according to an embodiment of the present invention of voltages to which are brought the control lines of memory 5 in a hold operation. Drain lines $DL_1$ and $DL_2$, gate lines $GL_1$ and $GL_2$, and source lines $SL_1$ and $SL_2$ are set to an identical hold voltage, greater than the reference voltage of memory 5. In the present example, the hold voltage is lower than half the voltage to which the drain line associated with a memory cell at the level of which a write operation is performed is brought. For a write operation which requires bringing the voltage of the drain line associated with a memory cell to be addressed to 2.5 V, the hold voltage is 1.2 V.

Figure 4:
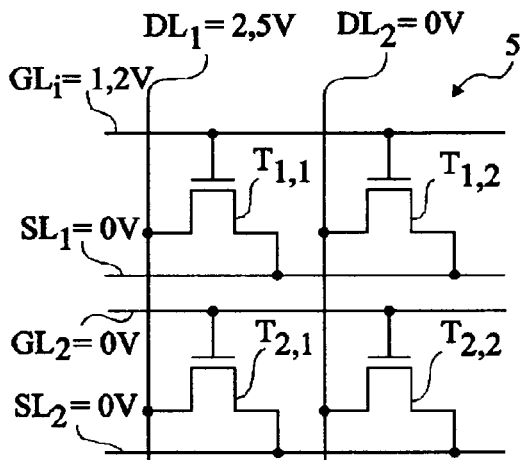
Figure 8:
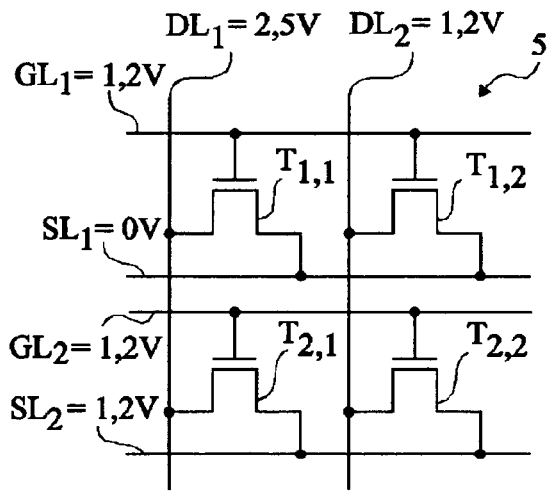

FIG. 8 shows an example according to an embodiment of the present invention of voltages to which the control lines of memory 5 are brought in an operation of writing of a "1" into memory cell $T_{1,1}$. As compared with the hold operation, the drain line $DL_1$ associated with memory cell $T_{1,1}$ to be addressed is set to the 2.5-V voltage and source lines $SL_1$ associated with memory cell $T_{1,1}$ to be addressed is set to the reference voltage, where the voltages of the other control lines are not modified. For the addressed memory cell $T_{1,1}$, a 2.5-V drain-source voltage and a 1.2-V gate voltage are thus obtained, as for the conventional write operation illustrated in FIG. 4. However, unlike a conventional write operation, the drain-source voltage of memory cell $T_{2,1}$ is 1.3 V, that is, much lower than the voltage obtained for a conventional write method.

Risks of leakage of positive charges stored in body 11 of memory cell $T_{2,1}$ are thus limited. An embodiment of the present invention thus advantageously enables limiting the risk of unwanted modification of the data stored in the memory cells of the same column as the addressed memory cell.

Figure 9:
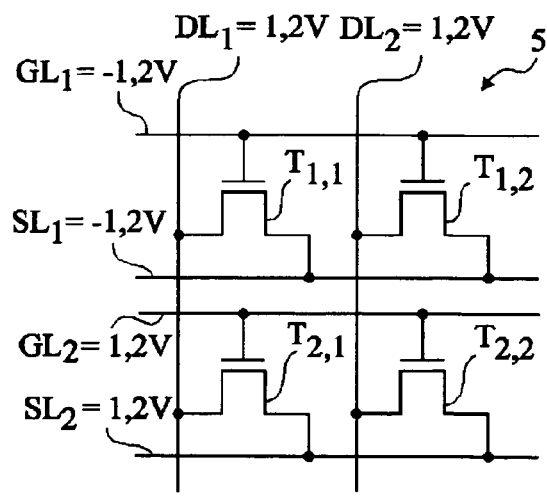

FIG. 9 shows an example according to an embodiment of the present invention of voltages to which are brought the control lines of memory 5 in an operation of erasing of the data stored in memory cells $T_{1,1}$ and $T_{1,2}$. As compared with the hold operation, gate lines $GL_1$ and source line $SL_1$ are set to the low voltage, in the present example, -1.2 V, where the voltages of the other control lines are not modified.

For each of transistors $T_{1,1}$ and $T_{1,2}$, the 1.2-V voltage applied to drain 20 tends to increase the voltage of body 11 by a coupling phenomenon and to make the junction between body 11 and source 19 conductive. In an erasing operation according to an embodiment of the present invention, drain 20 is brought to a voltage (1.2 V) greater than the voltage (0 V) to which it is brought in a conventional erasing operation. A better increase in the voltage of body 11 by coupling with drain 20, and thus an improvement in the erasing, are thus obtained.

Figure 5:
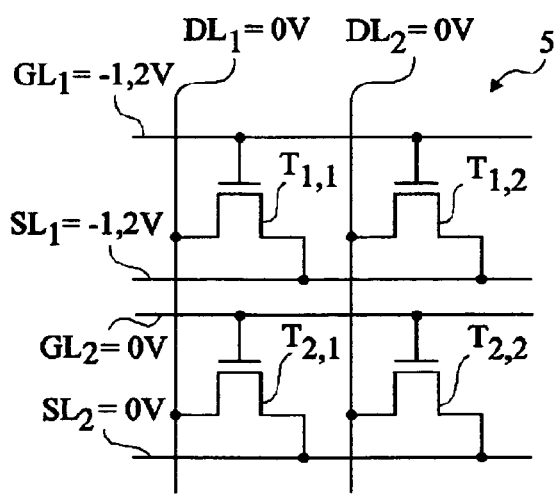

When a write operation is performed after a hold operation, an embodiment of the present invention provides having the voltage of drain line $DL_1$ associated with the memory cell to be addressed increase from 1.2 V to 2.5 V. For the conventional write operation illustrated in FIG. 4, this same line increases from 0 V to 2.5 V. An embodiment of the present invention thus enables a decrease in the memory consumption in a write operation. When an erasing operation is performed after a hold operation, an embodiment of the present invention provides having the voltage of source and gate lines $SL_1$ and $GL_1$ decrease from 1.2 V to -1.2 V. For the conventional erasing operation illustrated in FIG. 5, these same lines only decrease from 0 V to -1.2 V. The consumption in an erasing operation is thus higher for an embodiment of the present invention. However, an erasing operation is performed simultaneously for all the memory cells in a memory row by only performing a single switching of the source line associated with the memory cells to be deleted. Conversely, a write operation is performed memory cell per memory cell and requires a switching of the drain line associated with each addressed memory cell. An embodiment of the present invention thus enables a general power saving since in average, much more drain lines than source lines are switched.

Figure 6:
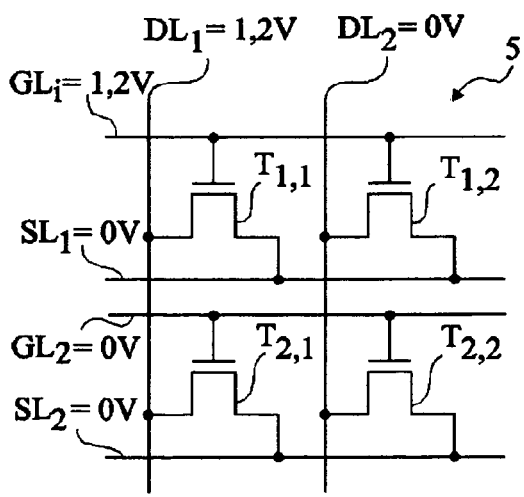
Figure 10:
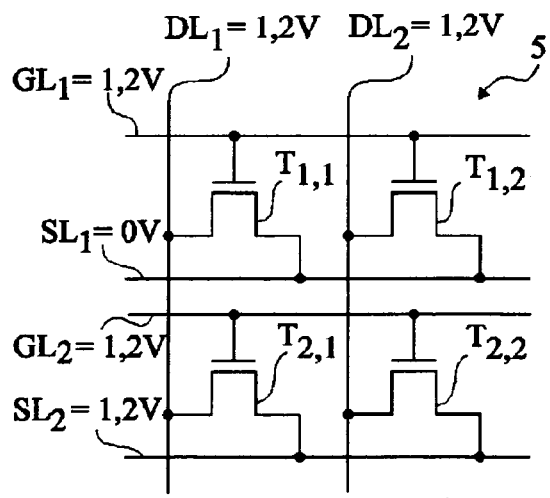

FIG. 10 shows an example according to an embodiment of the present invention of voltages to which are brought the control lines of memory 5 in an operation of reading the datum written in memory cell $T_{1,1}$. As compared with a hold operation, source line $SL_1$ associated with the addressed memory cell is set to the reference voltage, while the voltages of the other control lines are not modified. The terminals of memory cell $T_{1,1}$ are thus at the same voltages as those provided in the conventional read operation illustrated in FIG. 6. As compared with a conventional read operation, the addressing of a memory cell is obtained by modifying the voltage of source line $SL_1$ and not of the gate and drain lines associated with the considered memory cell.

A conventional read operation is generally performed after a hold operation and comprises a first step of raising of the voltage of drain line $DL_1$ associated with the memory cell to be addressed from 0 V to 1.2 V, which generally requires at least 30% of the total duration of a read operation. As an example, for a 10-ns read operation, the raising of the voltage of drain line $DL_1$ may last 3.5 ns. In the present example of embodiment, the voltage of drain line $DL_1$ does not vary and only the voltage of source line $SL_1$ varies in a write operation. However, the modification of the source line voltage can be performed much faster than the modification of the drain line voltage. Indeed, a read operation generally comprises the comparing of the current flowing through the addressed memory cell with the current flowing through a reference memory cell of the same row in the memory. It is thus necessary for the drain-source voltage applied to the addressed memory cell to be strictly identical to the drain-source voltage of the reference memory cell. The reference memory cell being associated with the same row as the addressed memory cell, they share the same source line while they are associated with different drain lines. For the drain-source voltages applied to the addressed memory cell and to the reference memory cell to be identical, the voltages to which are brought the drain lines associated with the addressed memory cell and with the reference memory cell must be defined with a high accuracy, while the accuracy to be provided for the voltage to which the source line is brought is less important since this voltage is directly applied to the two memory cells. A longer time is thus necessary to modify the voltage of the drain line associated with the memory cell to be addressed in a conventional read operation as compared with the time to be provided to modify the voltage of the source line associated with the memory cell to be addressed in a read operation according to an embodiment of the present invention. An embodiment of the present invention thus enables decreasing the general duration of a read operation by approximately 30%.

In the previously-described example of embodiment, the hold voltage to which the drain, source, and gate lines are brought in a hold operation is 1.2 V. Such a voltage can generally be obtained from a supply source which may further be used on the circuit comprising RAM 5 according to an embodiment of the present invention for the supply of low-voltage transistors.

The fact of holding the gate lines at the hold voltage (1.2V) for all the operations of memory 5 except for the erasing operation for which the gate line of the memory cell row to be deleted is brought to a negative voltage advantageously enables limiting the switchings to be performed at the level of the gate lines. However, according to an alternative embodiment of the present invention, in a hold operation, the voltage to which the gate lines are brought may be lower than the voltage to which the source and drain lines are brought. As an example, the gate hold voltage may be equal to 0 V. This is made possible by the fact that for a MOS transistor conventionally formed at the level of a single-crystal silicon wafer, as is the case, for example, for MOS transistor 10 shown in FIG. 2, the coupling between gate 22 and body 11 is low.

Of course, the present invention is likely to have various alterations, modifications, and improvements which will occur to those skilled in the art. In particular, although embodiments of the present invention have been described for N-channel transistor memory cells, it also applies to P-channel transistors, the signs of the voltages to which the control lines of memory 5 are brought being accordingly modified. It should further be noted that the present invention may also advantageously apply to a DRAM cell with a transistor formed in a floating body or well delimited depthwise by an insulating layer (SOI).

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A dynamic random access memory (DRAM) (5) comprising memory cells ($T_{1,1}$, $T_{1,2}$, $T_{2,1}$, $T_{2,2}$) distributed in rows and in columns, each memory cell comprising a MOS transistor (10) with a floating body (11), the memory comprising circuitry ($DL_1$, $DL_2$, $SL_1$, $SL_2$) for writing a datum into a determined memory cell belonging to a determined row and to a determined column, wherein the write circuitry comprises:

circuitry capable of bringing the drains of the memory cells of the determined column to a voltage $V_1$;
   circuitry capable of bringing the sources of the memory cells of the determined row to a voltage $V_2$; and
   circuitry capable of bringing the drains of the memory cells of the columns other than the determined column and the sources of the memory cells of the rows other than the determined row to a voltage $V_3$, voltages $V_1$, $V_2$, and $V_3$ being such that $|V_1-V_2|>|V_3-V_2|$ and $(V_1-V_2)\times(V_3-V_2)>0$,
   and characterized in that it comprises circuitry ($DL_1$, $DL_2$, $SL_1$, $SL_2$) for holding the data stored in the memory cells of the memory, the hold circuitry being capable of bringing the drains and the sources of all the memory cells in the memory to voltage $V_3$.

2. The memory of claim 1, comprising circuitry ($DL_1$, $DL_2$, $SL_1$, $SL_2$) for reading the datum stored in the determined memory cell, the read circuitry comprising:

circuitry capable of bringing the sources of the memory cells of the determined row to voltage $V_2$; and
   circuitry capable of bringing the drains of all the memory cells ($T_{1,1}$, $T_{1,2}$, $T_{2,1}$, $T_{2,2}$) in the memory and the sources of the memory cells of the rows other than the determined row to voltage $V_3$.

3. The memory of claim 1, comprising circuitry ($DL_1$, $DL_2$, $SL_1$, $SL_2$) for erasing the data stored in the memory cells of the determined row, the erasing circuitry comprising:

circuitry capable of bringing the sources and the gates of the memory cells of the determined row to a voltage $V_4$, voltage $V_4$ being such that $(V_1-V_2)\times(V_4-V_2)<0$; and
   circuitry capable of bringing the drains of all the memory cells ($T_{1,1}$, $T_{1,2}$, $T_{2,1}$, $T_{2,2}$) in the memory (5) and the sources of the memory cells of the rows other than the determined row to voltage $V_3$.

4. The memory of claim 1, wherein at least one circuitry ($GL_1$, $GL_2$) from among the group comprising the write circuitry, the hold circuitry, and the read circuitry is capable of bringing the gates of all the memory cells ($T_{1,1}$, $T_{1,2}$, $T_{2,1}$, $T_{2,2}$) in the memory (5) to voltage $V_3$.

5. A method for controlling a DRAM (5) comprising memory cells ($T_{1,1}$, $T_{1,2}$, $T_{2,1}$, $T_{2,2}$) distributed in rows and in columns, each memory cell comprising a MOS transistor (10) with a floating body (11), in which an operation of writing of a datum into a determined memory cell belonging to a determined row and to a determined column comprises the steps of:

bringing the drains of the memory cells of the determined column to a voltage $V_1$;
   bringing the sources of the memory cells of the determined row to a voltage $V_2$; and
   bringing the drains of the memory cells of the columns other than the determined column and the sources of the memory cells of the rows other than the determined row to a voltage $V_3$, voltages $V_1$, $V_2$, and $V_3$ being such that $|V_1-V_2|>|V_3-V_2|$ and $(V_1-V_2)\times(V_3-V_2)>0$, and characterized in an operation of holding of the data stored in the memory cells in the memory comprises the step of bringing the drains and the sources of all the memory cells in the memory to the same potential level, such as voltage $V_3$.

6. The control method of claim 5, wherein voltage $V_2$ is the ground voltage of the memory (5).

7. The control method of claim 5, wherein an operation of reading the datum stored in the determined memory cell comprises the steps of:

bringing the sources of the memory cells of the determined row to voltage $V_2$; and
   bringing the drains of all the memory cells ($T_{1,1}$, $T_{1,2}$, $T_{2,1}$, $T_{2,2}$) in the memory and the sources of the memory cells of the rows other than the determined row to voltage $V_3$.

8. The control method of claim 5, wherein an operation of erasing the data stored in the memory cells of the determined row comprises the steps of:

bringing the sources and the gates of the memory cells of the determined row to a voltage $V_4$, voltage $V_4$ being such that $(V_1-V_2)\times(V_4-V_2)<0$; and bringing the drains of all the memory cells ($T_{1,1}$, $T_{1,2}$, $T_{2,1}$, $T_{2,2}$) in the memory (5) and the sources of the memory cells of the rows other than the determined row to voltage $V_3$.

9. The control method of claim 5, wherein at least one of the operations from the group comprising the write operation, the hold operation, and the read operation comprises bringing the gates of all the memory cells ($T_{1,1}$, $T_{1,2}$, $T_{2,1}$, $T_{2,2}$) in the memory (5) to voltage $V_3$.

\* \* \* \* \*